(12) United States Patent
Shiino et al.

(10) Patent No.: US 8,314,455 B2
(45) Date of Patent: Nov. 20, 2012

(54) NON-VOLATILE SEMICONDUCTOR STORAGE DEVICE

(75) Inventors: Yasuhiro Shiino, Fujisawa (JP); Atsuhiro Sato, Yokohama (JP); Takeshi Kamigaichi, Yokohama (JP); Fumitaka Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/156,727

(22) Filed: Jun. 9, 2011

(65) Prior Publication Data

US 2011/0233652 A1 Sep. 29, 2011

Related U.S. Application Data

(63) Continuation of application No. 12/394,929, filed on Feb. 27, 2009, now Pat. No. 7,977,733.

(30) Foreign Application Priority Data

Mar. 17, 2008 (JP) ................................ 2008-067747

(51) Int. Cl.
*H01L 29/792* (2006.01)
(52) U.S. Cl. ............... 257/324; 257/326; 257/E29.309; 257/E21.423; 438/287
(58) Field of Classification Search .................... 257/324
See application file for complete search history.

(56) References Cited

U.S. PATENT DOCUMENTS

| 5,792,696 A * | 8/1998 | Kim et al. ...................... 438/258 |
| 2002/0173111 A1* | 11/2002 | Kasai ............................ 438/396 |
| 2007/0029607 A1* | 2/2007 | Kouznetzov .................. 257/321 |

FOREIGN PATENT DOCUMENTS

| JP | 8-162618 | 6/1996 |
| JP | 2003-188286 | 7/2003 |
| JP | 2006-128390 | 5/2006 |
| JP | 2007-180389 | 7/2007 |
| JP | 2007-266143 | 10/2007 |
| JP | 2007-317874 | 12/2007 |

* cited by examiner

*Primary Examiner* — Michelle Mandala
*Assistant Examiner* — Shaka White
(74) *Attorney, Agent, or Firm* — Oblon, Spivak, McClelland, Maier & Neustadt, L.L.P.

(57) ABSTRACT

A non-volatile semiconductor storage device includes: a memory cell area in which a plurality of electrically rewritable memory cells are formed; and a peripheral circuit area in which transistors that configure peripheral circuits to control the memory cells are formed. The memory cell area has formed therein: a semiconductor layer formed to extend in a vertical direction to a semiconductor substrate; a plurality of conductive layers extending in a parallel direction to, and laminated in a vertical direction to the semiconductor substrate; and a property-varying layer formed between the semiconductor layer and the conductive layers and having properties varying depending on a voltage applied to the conductive layers. The peripheral circuit area has formed therein a plurality of dummy wiring layers that are formed on the same plane as each of the plurality of conductive layers and that are electrically separated from the conductive layers.

11 Claims, 12 Drawing Sheets

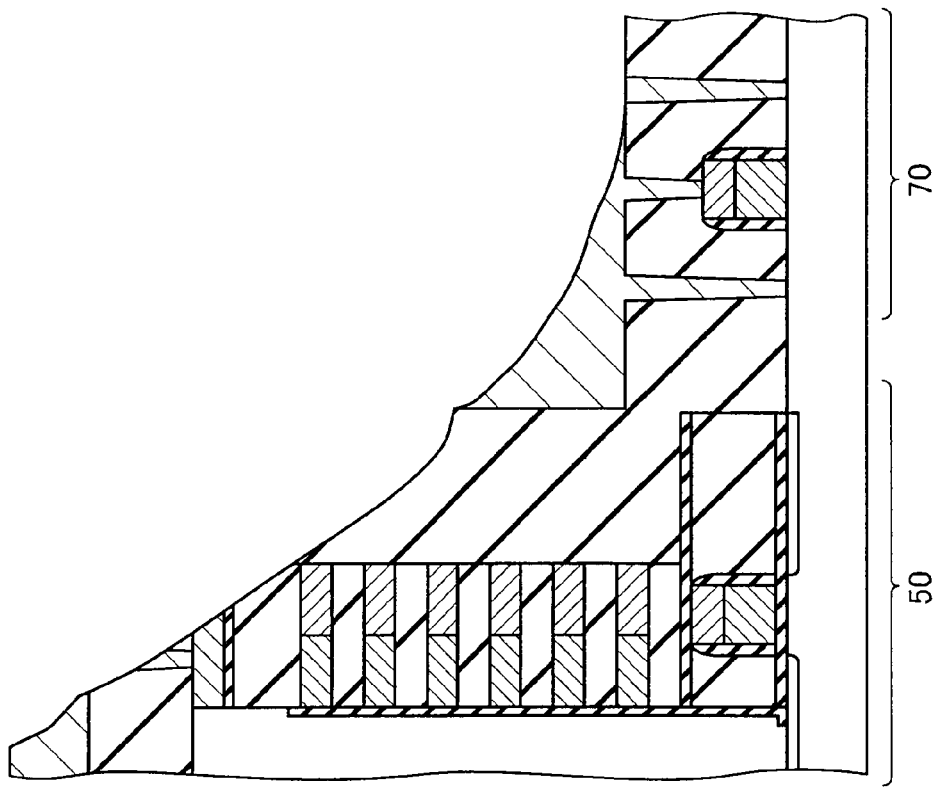
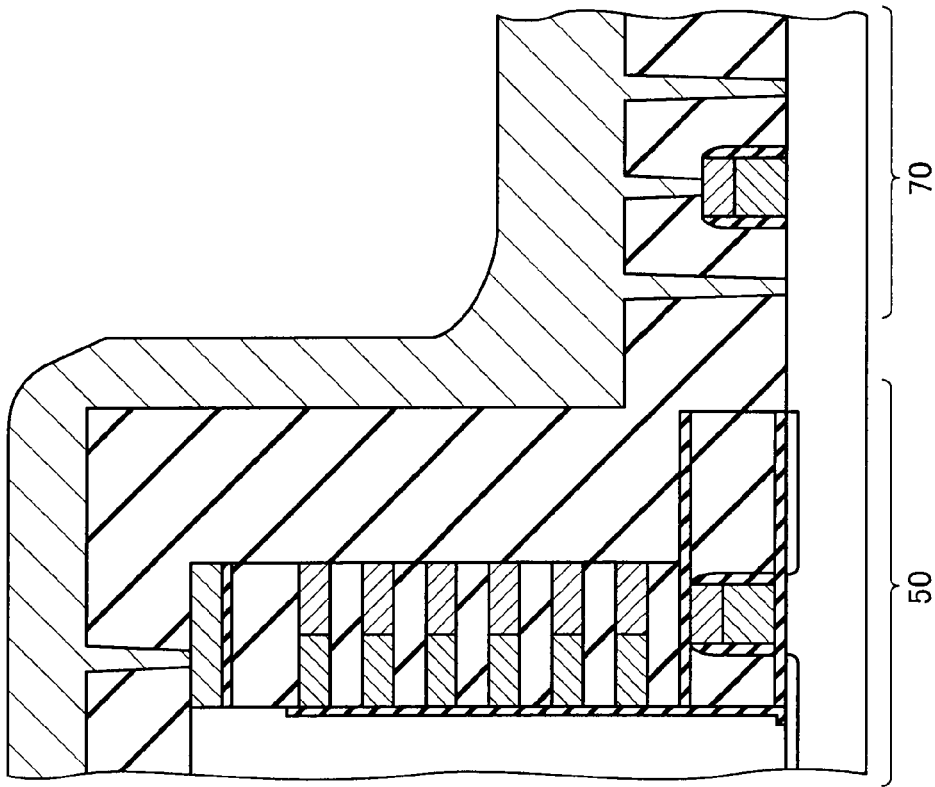
FIG. 5A
FIG. 5B

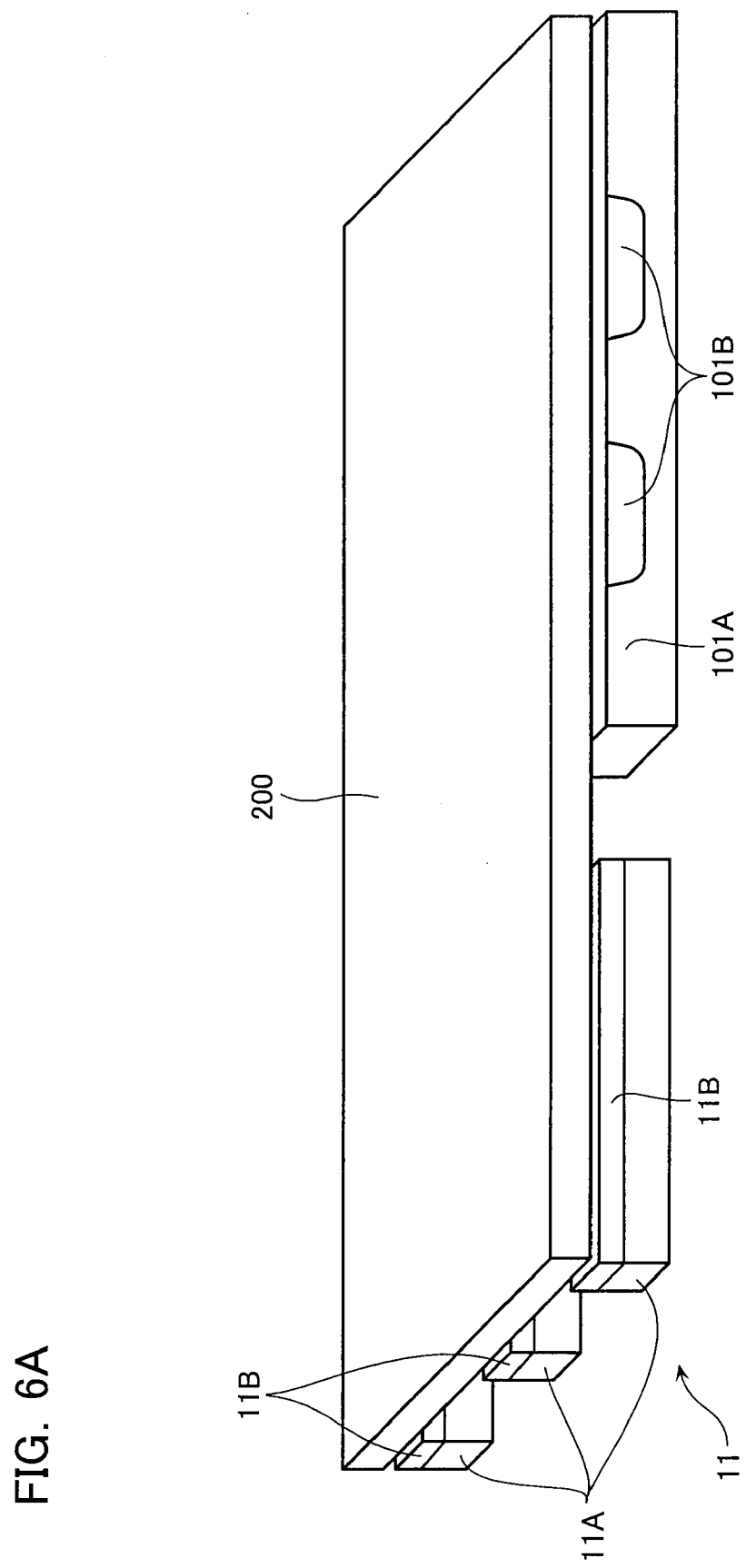

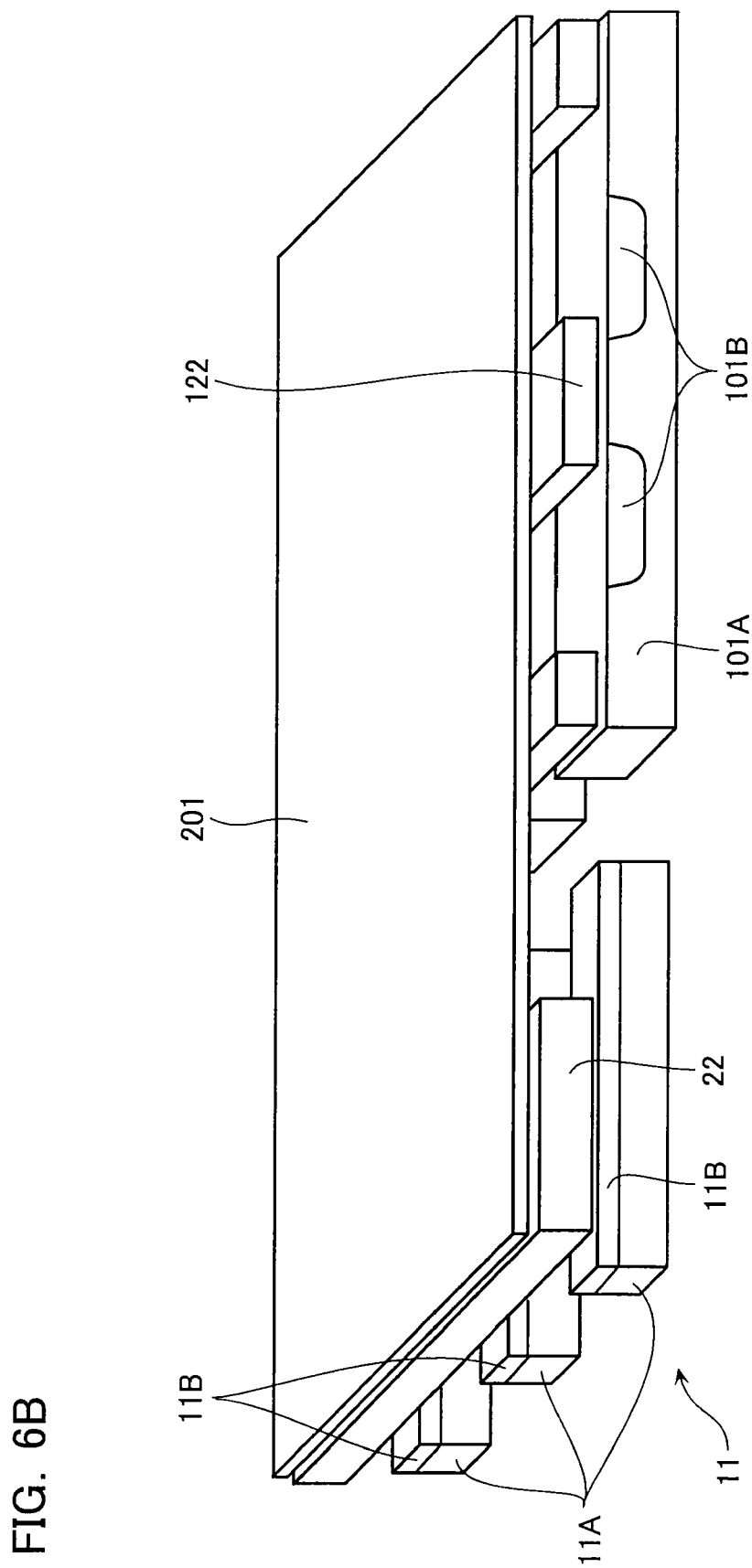

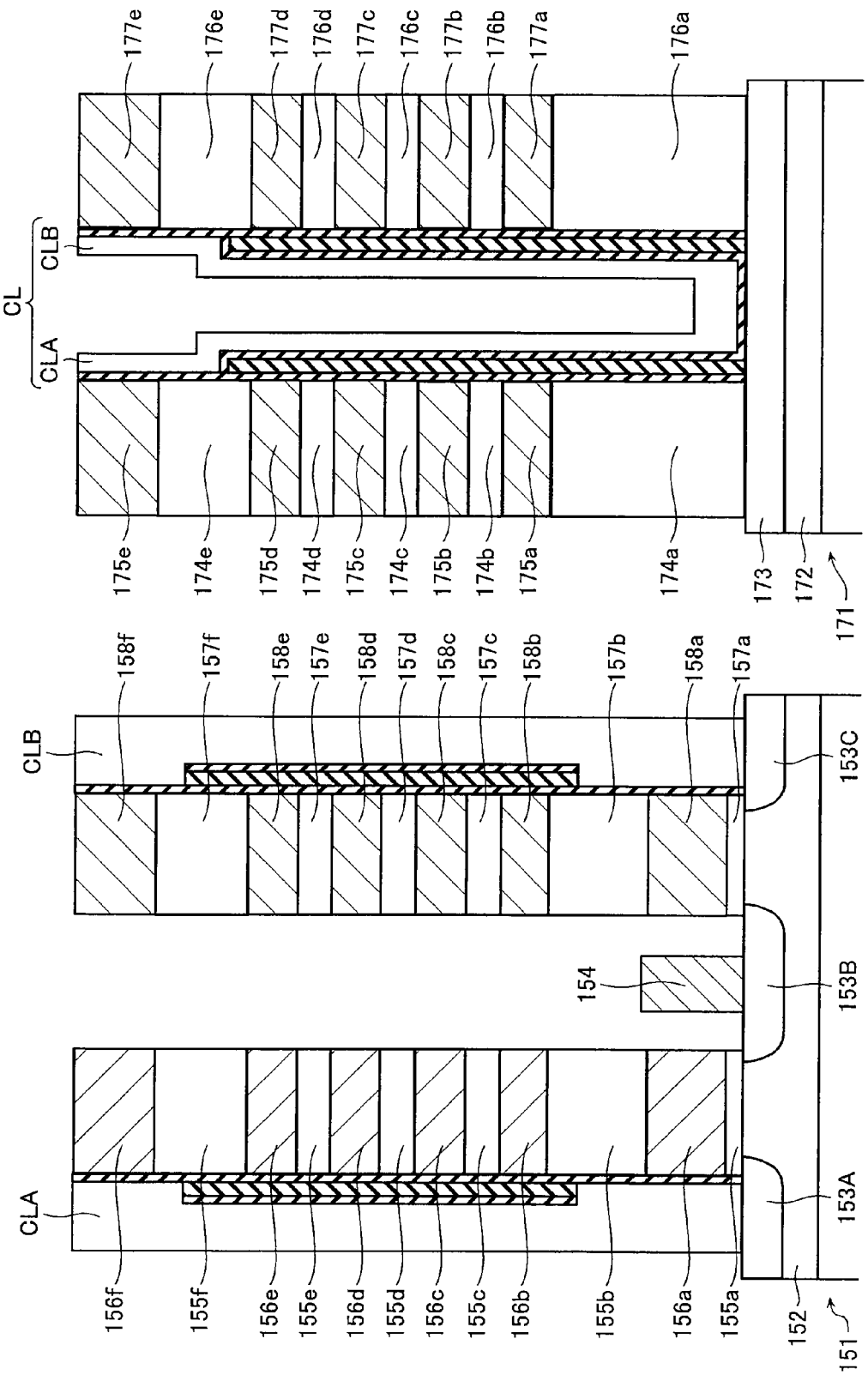

NON-VOLATILE SEMICONDUCTOR STORAGE DEVICE

CROSS REFERENCE TO RELATED APPLICATIONS

This application is a continuation of U.S. application Ser. No. 12/394,929 filed Feb. 27, 2009, and is based on and claims the benefit of priority from prior Japanese Patent Application No. 2008-67747, filed on Mar. 17, 2008, the entire contents of each of which are incorporated herein by reference.

BACKGROUND OF THE INVENTION

1. Field of the Invention

The present invention relates to a non-volatile semiconductor storage device, and in particular, to a lamination-type NAND flash memory.

2. Description of the Related Art

Conventionally, LSIs are formed by integration of devices in a two-dimensional plane on the silicon substrate. Although the dimension for each device must be reduced (refinement) to increase memory storage capacity, recent years are facing challenges in such refinement from the viewpoint of cost and technology. Such refinement requires further improvements in photolithography technology. However, if such refinement is accomplished, it is assumed that physical improvement limit, such as in breakdown voltage between devices, would be reached unless driving voltage are scaled.

Therefore, various measures have been considered recently to achieve a higher integration density of memory devices. For example, these measures include configurations such as using a multi-value technology, laminating memory cells in a three-dimensional manner (see, Japanese Patent Laid-Open No. 2007-317874), and using MEMS (Micro Electro Mechanical Systems).

However, for the configuration of laminating memory cells in a three-dimensional manner, some difference in height is involved between transistors that form a memory cell part and others that are formed on the same substrate and configure a peripheral circuit part. Accordingly, this would cause a difference in depth of focus in exposure, which may result in the upper portion of the memory cell part dishing in Chemical Mechanical Polishing, residual films being left on the top surface of the peripheral circuit part, and so on, leading to unstable operation of the manufactured products.

Therefore, in the prior art, it is difficult to provide lamination-type non-volatile semiconductor storage devices with stable operation.

SUMMARY OF THE INVENTION

One aspect of the present invention provides a non-volatile semiconductor storage device comprising: a memory cell area in which a plurality of electrically rewritable memory cells are formed; and a peripheral circuit area in which transistors are formed, the transistors configuring peripheral circuits to control the memory cells, the memory cell area comprising: a semiconductor layer formed to extend in a vertical direction to a semiconductor substrate; a plurality of conductive layers extending in a parallel direction to the semiconductor substrate, and laminated in a vertical direction to the semiconductor substrate; and a property-varying layer formed between the semiconductor layer and the conductive layers and having properties varying depending on a voltage applied to the conductive layers, and the peripheral circuit area comprising: a plurality of dummy wiring layers each formed on the same plane as each of the plurality of conductive layers and electrically separated from the conductive layers.

In addition, another aspect of the present invention provides a method of manufacturing a non-volatile semiconductor storage device having a plurality of memory strings with a plurality of electrically rewritable memory cells connected in series and peripheral circuits controlling the memory cells, the method comprising: alternately laminating interlayer insulation layers and conductive layers; separating the interlayer insulation layers and the conductive layers to an area where the memory cells are formed and an area where the peripheral circuits are formed, separating the conductive layers into a memory-cell conductive layer and a dummy wiring layer, and separating the interlayer insulation layers into a memory-cell interlayer insulation layer and a dummy interlayer insulation layer; forming a first hole to penetrate the memory-cell interlayer insulation layer and the memory cell conductive layer; forming a second hole to penetrate the dummy interlayer insulation layer and the dummy wiring layer; forming a semiconductor layer in the first hole via a first insulation layer, the semiconductor layer extending downward from the upper end of the first hole; and forming a contact in the second hole via a second insulation layer, the contact extending downward from the upper end of the second hole.

BRIEF DESCRIPTION OF THE DRAWINGS

FIG. 5 is a cross-sectional view illustrating a part of a lamination-type flash memory with no dummy wiring layer formed in the peripheral circuit area;

FIG. 6A is a diagram illustrating a method of manufacturing the lamination-type NAND flash memory;

FIG. 6B is a diagram illustrating the method of manufacturing the lamination-type NAND flash memory;

FIGS. 7A and 7B illustrate other configurations of the memory strings.

DETAILED DESCRIPTION OF THE EMBODIMENTS

A non-volatile semiconductor storage device (hereinafter, referred to as a "lamination-type NAND flash memory") according to an embodiment of the present invention will now be described below based on the accompanying drawings.

Configuration of this Embodiment

Figure 1:
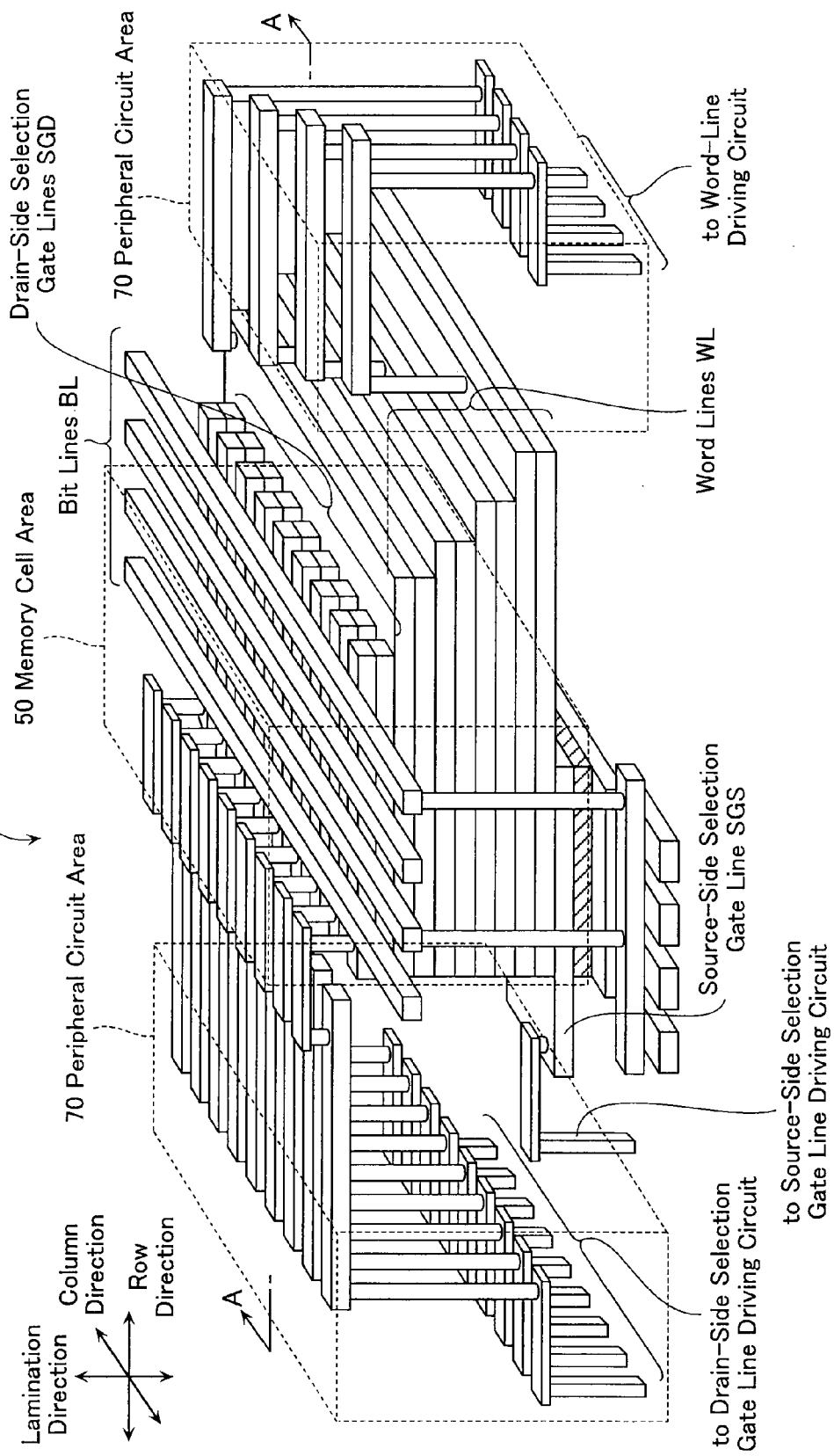
FIG. 1 is a schematic diagram illustrating a lamination-type NAND flash memory according to an embodiment of the present invention.

FIG. 1 is a schematic diagram illustrating a lamination-type NAND flash memory 10 according to the present invention. The lamination-type NAND flash memory 10 according to this embodiment includes the following areas: a memory cell area 50 and a peripheral circuit area 70.

The memory cell area 50 includes a plurality of memory transistors MT, each having a charge accumulation layer in its gate.

Although not specifically illustrated in FIG. 1, the peripheral circuit area 70 includes a word-line driving circuit, a source-side selection gate line (SGS) driving circuit, a drain-side selection gate line (SGD) driving circuit, a sense amplifier, and so on.

The word-line driving circuit controls the voltage applied to word lines WL. The source-side selection gate line (SGS) driving circuit controls the voltage applied to a source-side selection gate line SGS. The drain-side selection gate line (SGD) driving circuit controls the voltage applied to drain-side selection gate lines SGD. The sense amplifier amplifies the voltage read from the memory transistors MT. As illustrated in FIG. 1, the memory transistors MT that are included in the memory cell area 50 are formed by alternately laminating semiconductor layers and insulation layers.

Figure 2:
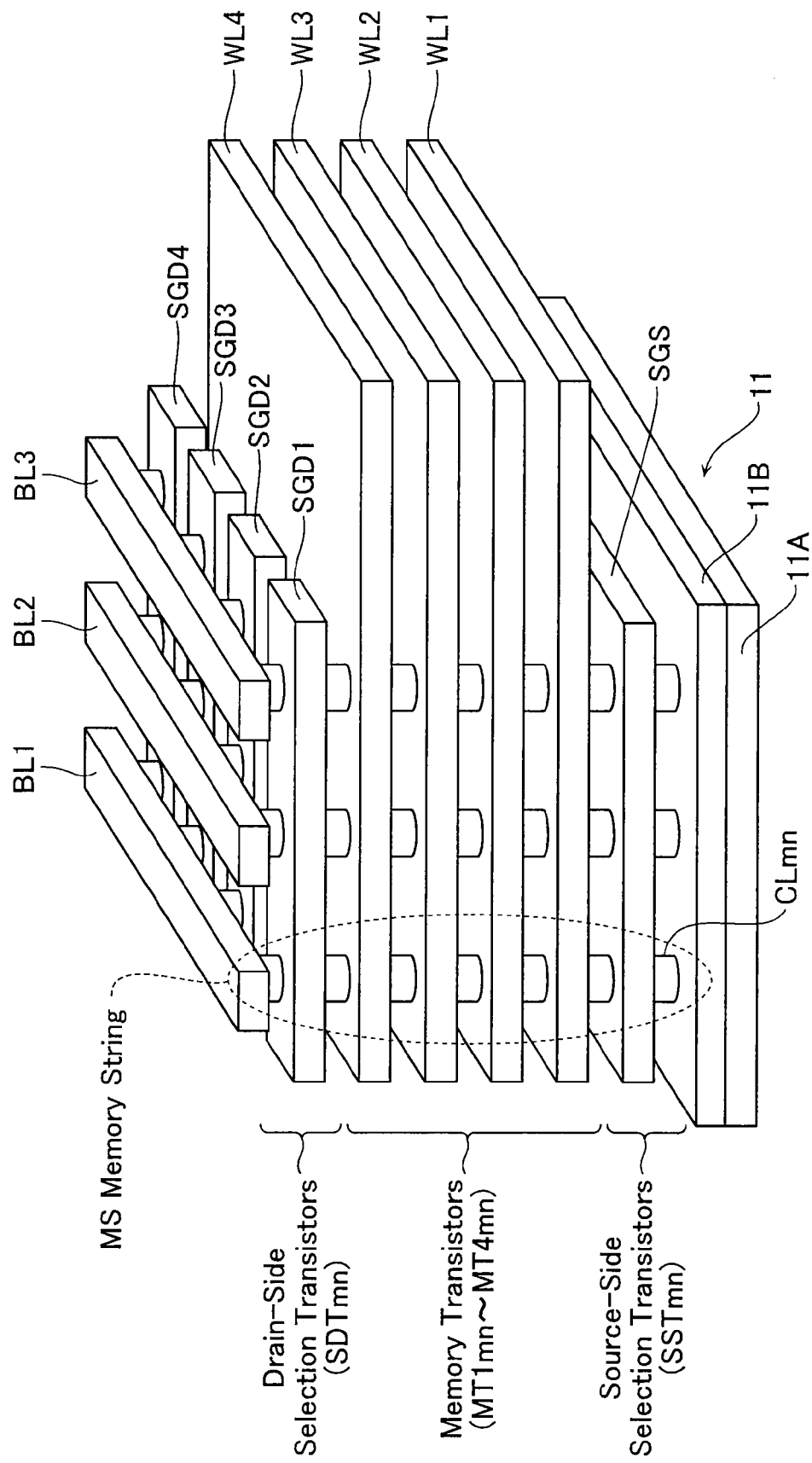
FIG. 2 is a perspective view illustrating a part of the lamination-type NAND flash memory.

FIG. 2 is a perspective view illustrating a part of the memory cell area 50 in the lamination-type NAND flash memory 10 according to this embodiment.

The memory cell area 50 has m×n (m, n=natural number) memory strings MS, each of which includes memory transistors MT1$mn$ to MT4$mn$, a source-side selection transistor SSTmn, and a drain-side selection transistor SDTmn. In FIG. 2, given that m=3, n=4. Note that, for illustrative purposes, the insulation layers formed between the neighboring semiconductor layers are omitted from FIG. 2.

In the memory strings MS, all gates of the memory transistors MTr1$mn$ are connected to a word line WL1. Similarly, in the memory strings MS, all gates of the memory transistors MT2$mn$, MT3$mn$, and MT4$mn$ are connected to their corresponding word lines WL2, WL3, and WL4, respectively.

As illustrated in FIGS. 1 and 2, the lamination-type NAND flash memory 10 according to this embodiment has the word lines WL1 to WL4 that are formed to extend in a direction parallel to a semiconductor substrate 11 and to be laminated in the lamination direction (vertical direction).

In addition, as illustrated in FIG. 1, the row-direction ends of the word lines WL1 to WL4 are formed in a stepwise manner in relation to each other. Wherein, the column direction represents a direction parallel to the semiconductor substrate and in which bit lines BL extend. The row direction represents a direction parallel to the semiconductor substrate 11 and in which the word lines WL extend. The vertical direction represents a direction vertical to the semiconductor substrate 11, the word lines WL, and the bit lines BL.

Each of the memory strings MS has a columnar semiconductor CLmn (in the case of FIG. 2, m=1 to 3, n=1 to 4) on an n$^+$ type diffusion area (11B, as described later) that is formed on a p$^-$ type area (P-well area) 11A in the semiconductor substrate 11. The columnar semiconductors CLmn are formed in a vertical direction to the semiconductor substrate 11 and arranged in a matrix form on the respective surfaces of the semiconductor substrate 11 and the word lines (WL1 to WL4). That is, the memory strings MS are also arranged in a matrix form within a plane vertical to the columnar semiconductor CLmn. Note that the columnar semiconductors CLmn may be columnar or prismatic in shape. In addition, the columnar semiconductors CLmn include terraced columnar semiconductors.

As illustrated in FIG. 2, drain-side selection gate lines SGD with rectangular plate shapes (in the case of FIG. 2, SGD1 to SGD4), which configure respective drain-side selection transistors SDTmn, are formed on the vertical top surface with respect to the word line WL4 via insulation films (not illustrated). Note that the drain-side selection gate lines SGD are insulated and isolated from each other and, unlike the word lines WL1 to WL4, formed to extend in the row direction, and formed in lines repeatedly provided in the column direction. In addition, columnar semiconductors CLmn are formed to penetrate the center in the column direction of the drain-side selection gate lines SGD.

As illustrated in FIG. 2, a source-side selection gate line SGS, which configure a source-side selection transistor SSTmn, is formed on the vertical bottom surface with respect to the word line WL1 via an insulation film (not illustrated). The source-side selection gate line SGS is formed to expand in a two-dimensional manner in the horizontal direction, as in the word lines WL1 to WL4. Note that, in addition to the structure as illustrated in FIG. 2, the source-side selection gate line SGS may be formed to extend in the row direction, and formed in strips repeatedly provided in the column direction.

Figure 3:
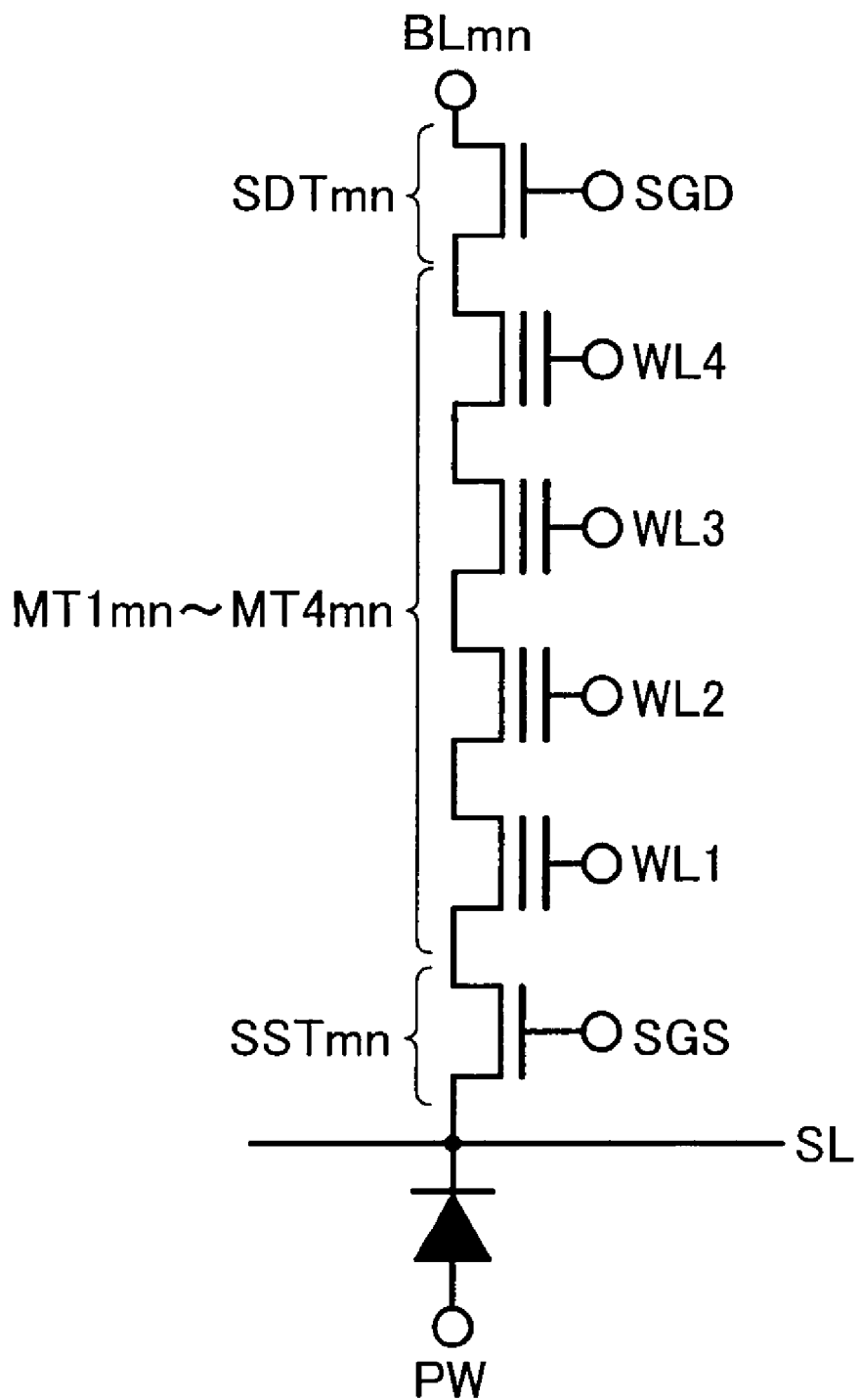
FIG. 3 is a circuit diagram illustrating a part of the lamination-type NAND flash memory.

Referring now to FIGS. 2 and 3, the circuit configuration and operation of the memory strings MS that configure the lamination-type NAND flash memory 10 according to the first embodiment will be described below. FIG. 3 is a circuit diagram illustrating one memory string MS.

As illustrated in FIGS. 2 and 3, each of the memory strings MS has four memory transistors MT1$mn$ to MT4$mn$, a source-side selection transistor SSTmn, and a drain-side selection transistor SDTmn. These four memory transistors MT1$mn$ to MT4$mn$, the source-side selection transistor SSTmn, and the drain-side selection transistor SDTmn are connected in series to each other (see FIG. 3).

In each of the memory strings MS, a columnar semiconductor CLmn is formed on an n$^+$ type diffusion area 11B that is formed in a p$^-$ type area (P-well area) 11A on the semiconductor substrate 11. Note that the n$^+$ type diffusion area 11B functions as a source line SL, which is connected to the source of the corresponding source-side selection transistor SSTmn.

In addition, a bit line BL is connected to the drain of the corresponding drain-side selection transistor SDTmn.

Each of the memory transistors MTrmn has a columnar semiconductor CLmn, a charge accumulation layer formed to surround the columnar semiconductor CLmn, and a word line WL formed to surround the charge accumulation layer. Each word line WL functions as a control gate electrode of the corresponding memory transistor MTmn.

In the lamination-type NAND flash memory 10 according to this embodiment, the voltages applied to the bit lines BL1 to BL3 are controlled by bit-line driving circuits (not illustrated). In addition, the voltages applied to the drain-side selection gate lines SGD are controlled by drain-side selection gate line driving circuits (not illustrated). Further, the voltages applied to the word lines WL1 to WL4 are controlled by word-line driving circuits (not illustrated). The voltage applied to the source-side selection gate line SGS is controlled by a source-side selection gate line driving circuit (not illustrated). The voltage applied to the source line SL is controlled by a source-line driving circuit (not illustrated). These circuits control charges of the charge accumulation layers in the memory transistors MTmn to read, write, and erase data.

Figure 4A:
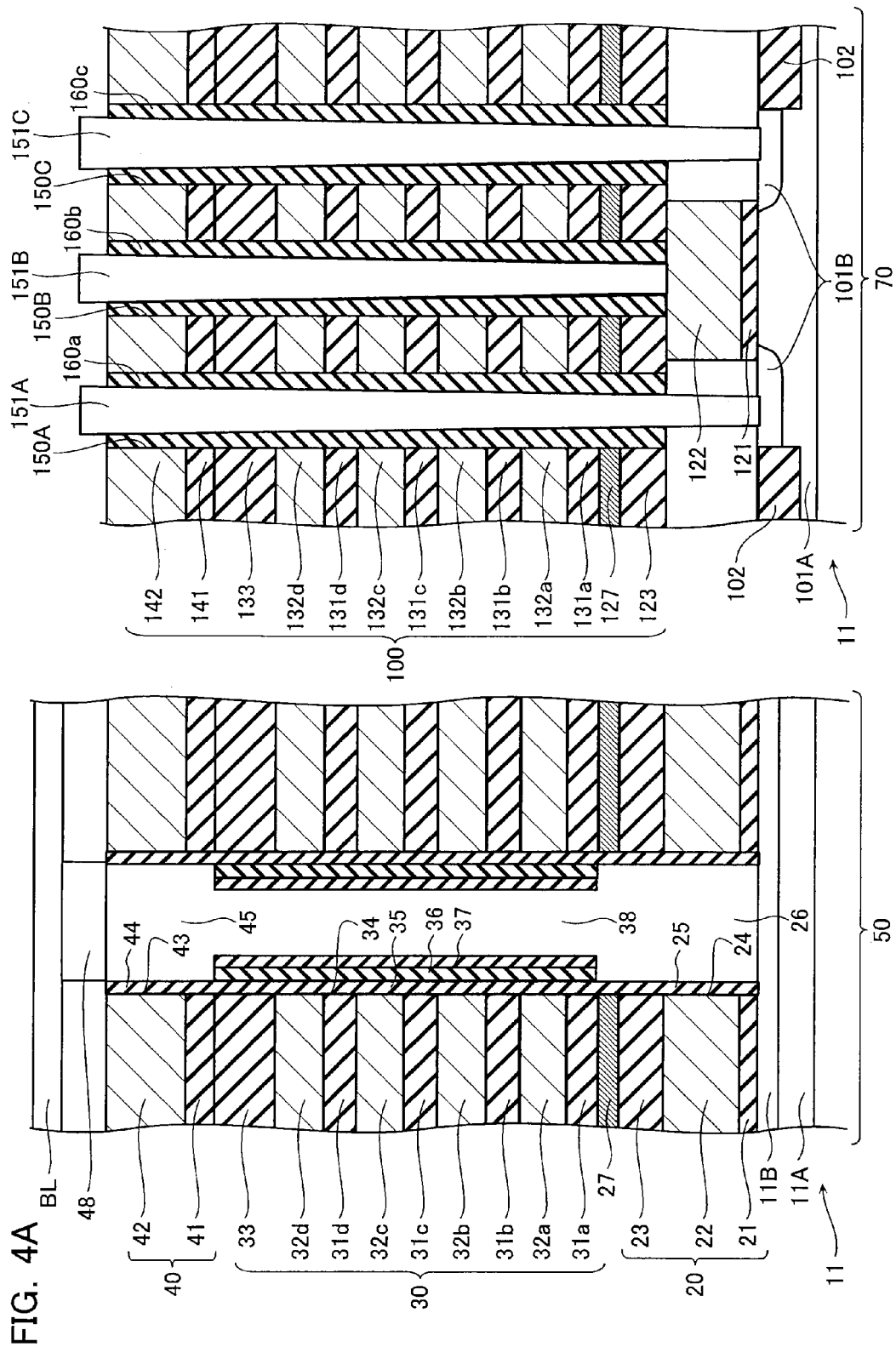
FIG. 4A is a cross-sectional view taken along the line A-A of FIG. 1.
Figure 4B:
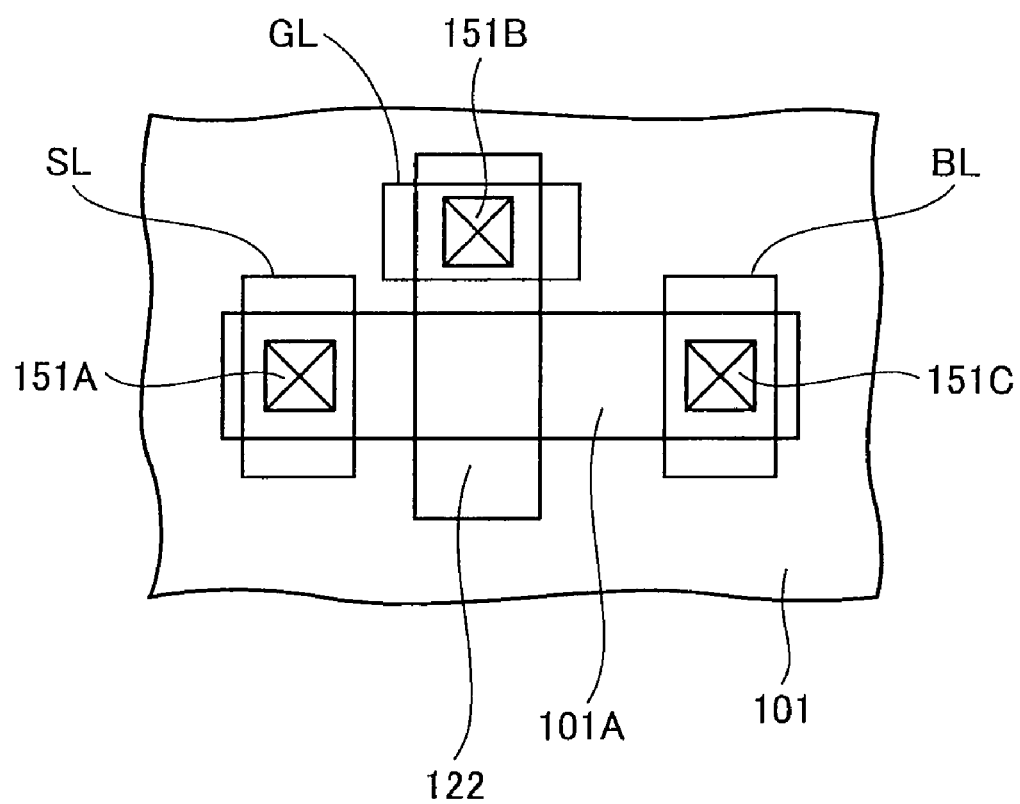
FIG. 4B is a top plan view illustrating a part of FIG. 4A.

Referring now to FIGS. 4A and 4B, a specific configuration of the lamination-type NAND flash memory 10 according to this embodiment will be described below. FIG. 4A is a cross-sectional view (taken along the line A-A of FIG. 1) illustrating parts of the memory cell area 50 and the peripheral circuit area 70 in the lamination-type NAND flash memory 10.

The memory cell area 50 is first described below.

As illustrated in FIG. 4A, the memory cell area 50 is formed by lamination of a source-side selection transistor layer 20, a memory transistor layer 30, and a drain-side selection transistor layer 40, in the vertical direction on the semiconductor substrate 11. The source-side selection transistor layer 20 (the bottom conductive layer), which is formed in the closest proximity to the semiconductor substrate 11, functions as a source-side selection transistor SSTmn. The memory transistor layer 30 functions as memory transistors MTmn. The drain-side selection transistor layer 40 functions as a drain-side selection transistor SDTmn.

The semiconductor substrate 11 has a p⁻ type area (P-well area) 11A formed thereon. In addition, the p⁻ type area 11A has an n⁺ area 11B formed thereon.

The source-side selection transistor layer 20 has a source-side first insulation layer 21, a source-side conductive layer 22, and a source-side isolation and insulation layer 23 that are sequentially laminated on the n⁺ area 11B formed on the semiconductor substrate 11.

The source-side first insulation layer 21, the source-side conductive layer 22, and the source-side isolation and insulation layer 23 are formed in the memory cell area 50 so as to expand in a two-dimensional manner in the horizontal direction parallel to the semiconductor substrate 11. In addition, the source-side first insulation layer 21, the source-side conductive layer 22, and a source-side isolation and insulation layer 23 are arranged separately for each predetermined area (erase unit) in the memory cell area 50.

The source-side first insulation layer 21 is formed by silicon oxide. The source-side conductive layer 22 is formed by polysilicon. The source-side isolation and insulation layer 23 is formed by silicon nitride.

In addition, a source-side hole 24 (first hole) is formed to penetrate the source-side isolation and insulation layer 23, the source-side conductive layer 22, and the source-side first insulation layer 21. A source-side gate insulation layer 25 and a source-side columnar semiconductor layer 26 are sequentially formed on the sidewall facing the source-side hole 24.

The source-side gate insulation layer 25 is formed by silicon oxide. The source-side columnar semiconductor layer 26 is formed by n⁻ type polysilicon.

In the source-side selection transistor layer 20, the source-side conductive layer 22 functions as the source-side selection gate line SGS. In addition, the source-side conductive layer 22 functions as the control gate of the source-side selection transistor SSTmn.

An isolation layer 27 formed by aluminum oxide is laminated on the source-side isolation and insulation layer 23. The isolation layer 27 is formed in the memory cell area 50 so as to expand in a two-dimensional manner in the horizontal direction parallel to the semiconductor substrate 11. The isolation layer 27 is separated from predetermined area (erase unit) in the memory cell area 50, as in the source-side first insulation layer 21, the source-side conductive layer 22, and the source-side isolation and insulation layer 23.

The memory transistor layer 30 has first to fourth insulation layers between word lines 31a to 31d that are laminated on the source-side isolation and insulation layer 23, first to fourth word-line conductive layers 32a to 32d that are formed one above the other with the first to fourth insulation layers between word lines 31a to 31d, and a memory isolation and insulation layer 33 that is laminated on the fourth insulation layer between word lines 31d.

The first to fourth insulation layers between word lines 31a to 31d, the first to fourth word-line conductive layers 32a to 32d, and the memory isolation and insulation layer 33 are each formed to expand in a two-dimensional manner in the row and column directions. They are also formed in a stepwise manner in relation to each other at their row-direction ends.

The first to fourth insulation layers between word lines 31a to 31d are formed by silicon oxide. The first to fourth word-line conductive layers 32a to 32d are formed by polysilicon. The memory isolation and insulation layer 33 is formed by silicon nitride.

In addition, the memory transistor layer 30 has a memory hole 34 (first hole) formed therein so as to penetrate the memory isolation and insulation layer 33, the first to fourth insulation layers between word lines 31a to 31d, and the first to fourth word-line conductive layers 32a to 32d. Note that the memory hole 34 is formed at a position matching the source-side hole 24.

A block insulation layer (first insulation layer) 35, a charge accumulation layer (property-varying layer) 36, a tunnel insulation layer 37, and a memory columnar semiconductor layer 38 are formed in the memory hole 34. The memory columnar semiconductor layer 38 is formed to extend in the vertical direction to the semiconductor substrate 11.

The block insulation layer 35, the charge accumulation layer 36, and the tunnel insulation layer 37 are sequentially formed on the respective sidewalls of the first to fourth word-line conductive layers 32a to 32d, the first to fourth insulation layers between word lines 31a to 31d, and the memory isolation and insulation layer 33.

The block insulation layer 35 and the tunnel insulation layer 37 are formed by silicon oxide, for example. The charge accumulation layer 36 is formed by silicon nitride, for example. The charge accumulation layer 36 is configured to be able to accumulate charges, and its charge accumulation states (properties) vary depending on a potential applied to the first to fourth word-line conductive layers 32a to 32d. Referring now to FIG. 2, the "write operation" and "read operation" in the memory transistors MT1 to MT4 of one memory string MS according to this embodiment will be described below. AS an example, description is made with reference to the memory transistor MT3.

When writing data "0" to the memory transistor MT3, i.e., when increasing the threshold of the memory transistor by injecting electrons into the charge accumulation layer 36 of the memory transistor MT3, a voltage of 0V is applied to the corresponding bit line BL, a voltage Vdd (e.g., 3.0V) to the source line SL, a voltage Vdd (e.g., 3.0V) to the selection gate lines SGD, a voltage Voff (e.g., 0V) to the selection gate line SGS, and a voltage Vpw (e.g., 0V) to the P-well area 11A.

In addition, a voltage Vprog (e.g., 18V) is applied to the word line WL3 of the memory transistor (MT3) for writing, and a voltage Vpass (e.g., 10V) is applied to the other word lines WL. This provides a greater field intensity only in the memory transistor (MT3) that is applied to the charge accumulation layer 36, by which electrons are injected into the charge accumulation layer. That is, the threshold of the memory transistor MT3 increases.

When writing data "1" to the memory transistor MT3, i.e., when the threshold of the memory transistor MT3 is not increased and the erasing state is maintained (without any electrons injected into the charge accumulation layer), a voltage Vdd (e.g., 3.0V) is applied to the corresponding bit line BL. As a result, the gate potential and the source potential of the selection transistor SDT become the same and the selection transistor SDT is switched to off state. Accordingly, the electric potential difference between the channel-forming area (body part) of the memory transistor MT3 and the word line WL3 is reduced, and hence no electrons are injected into the charge accumulation layer 36 of the memory transistor MT3.

When reading data from the memory transistor MT3, a voltage Vbl (e.g., 0.7V) is applied to the corresponding bit line BL, a voltage of 0V to the source line SL, a voltage Vdd (e.g., 3.0V) to the selection gate lines SGD and SGS, and a voltage Vpw (e.g., 0V) to the P-well area 11A. Then, a voltage of 0V is applied to the word line WL3 that is connected to the memory transistor (MT3) for reading, and a voltage Vread (e.g., 4.5V) is applied to the other word lines WL. The current flowing through the bit line BL varies depending on whether the threshold of the memory transistor (MT3) is greater or less than 0V. The current flowing through the bit line BL is sensed, then data information of the memory transistor (MT3) is read out.

Referring again to FIG. 4A, the configuration of the lamination-type NAND flash memory is described below.

The memory columnar semiconductor layer 38 is composed of $n^-$ type polysilicon.

In the memory transistor layer 30, the first to fourth word-line conductive layers 32a to 32d function as the word lines WL1 to WL4. In addition, the first to fourth word-line conductive layers 32a to 32d function as the control gates of the memory transistors MTmn.

In addition, the tunnel insulation layer 37 formed by silicon oxide functions as a potential barrier, such as when charges are accumulated in the charge accumulation layer 36 from the memory columnar semiconductor layer 38, or when the charges accumulated in the charge accumulation layer 36 diffuse to the memory columnar semiconductor layer 38. Similarly, the block insulation layer 35 also functions as a potential barrier to prevent the charges accumulated in the charge accumulation layer 36 from diffusing to the first to fourth word-line conductive layers 32a to 32d.

The drain-side selection transistor layer 40 has a drain-side insulation layer 41 and a drain-side conductive layer 42 that are sequentially laminated on the memory isolation and insulation layer 33.

The drain-side insulation layer 41 and the drain-side conductive layer 42 are formed at positions matching the upper portion of the memory columnar semiconductor layer 38, and formed in a rectangular plate-like manner so as to extend in the row direction. In addition, they are repeatedly formed in the column direction.

The drain-side insulation layer 41 is formed by silicon oxide. The drain-side conductive layer 42 is formed by polysilicon.

In addition, the drain-side selection transistor layer 40 has a drain-side hole 43 (first hole) formed therein so as to penetrate the drain-side conductive layer 42 and the drain-side insulation layer 41. The drain-side hole 43 is formed at a position matching the memory hole 34. A drain-side gate insulation layer 44 and a drain-side columnar semiconductor layer 45 are sequentially formed on the respective sides of the drain-side conductive layer 42 and the drain-side insulation layer 41 that face the drain-side hole 43.

The drain-side gate insulation layer 44 is formed by silicon oxide. The drain-side columnar semiconductor layer 45 is formed by $p^-$ type polysilicon. In addition, a columnar semiconductor layer 48 formed by $n^+$ type polysilicon is laminated on the vertical top surface with respect to the drain-side columnar semiconductor layer 45, and is connected to the corresponding bit line BL.

In the drain-side selection transistor layer 40, the drain-side conductive layer 42 functions as a drain-side selection gate line SGD. In addition, the drain-side conductive layer 42 functions as the control gate of the corresponding drain-side selection transistor SDTmn.

Next, the peripheral circuit area 70 is described below.

Although not specifically illustrated in FIG. 4A, the peripheral circuit area 70 has the following components formed therein for controlling memory cells MC: a word-line driving circuit, a drain-side selection gate line driving circuit, a source-side selection gate line driving circuit, a read circuit, a write circuit, an input/output buffer, etc. In addition, these peripheral circuits are formed by combination of multiple planar-type transistors.

Illustrated on the right in FIG. 4A is a cross-sectional view of one planar-type transistor formed in the peripheral circuit area 70.

A $p^-$ type area (P-well area) 101A is formed on the semiconductor substrate 11 in the peripheral circuit area 70. The $p^-$ type area 101A has a plurality of $n^+$ areas 101B formed thereon corresponding to the source/drain areas of the planar-type transistor. The planar-type transistors are electrically isolated from each other by device isolation and insulation films 102.

An insulation layer 121 and a transistor conductive layer 122 are sequentially laminated between the $n^+$ areas 101B on the semiconductor substrate 11. The insulation layer 121 and the transistor conductive layer 122 are formed in the peripheral circuit area 70 so as to expand in a two-dimensional manner in the horizontal direction parallel to the semiconductor substrate 11, and provided separately for each transistor.

The transistor conductive layer 122 is formed by polysilicon and functions as the gate electrodes of the corresponding planar-type transistors that configure the peripheral circuits. An insulation film 121 is formed by silicon oxide and functions as gate insulation films of the planar-type transistors.

A first isolation and insulation layer 123, an isolation layer 127, first to fourth insulation layers 131a to 131d, first to fourth conductive layers 132a to 132d, a second isolation and insulation layer 133, a fifth insulation layer 141, and a fifth conductive layer 142 are sequentially laminated on the top surface of the transistor conductive layer 122, as in the memory cell area 50.

Note that the first isolation and insulation layer 123 is laminated to a height comparable to that of the source-side isolation and insulation layer 23 formed in the memory cell area 50 (in other words, it is formed on the same plane as the source-side isolation and insulation layer 23). The isolation layer 127 is laminated to a height comparable to that of the isolation layer 27. The first to fourth insulation layers 131a to 131d are each laminated to a height comparable to that of the first to fourth insulation layers between word lines 31a to 31d, respectively. The first to fourth conductive layers 132a to 132d are each laminated to a height comparable to that of the first to fourth word-line conductive layers 32a to 32d, respectively. The second isolation and insulation layer 133 is laminated to a height comparable to that of the memory isolation layer 33. The fifth insulation layer 141 is laminated to a height comparable to that of the drain-side insulation layer 41. The fifth conductive layer 142 is laminated to a height comparable to that of the drain-side conductive layer 42.

In addition, the first isolation and insulation layer 123, the isolation layer 127, the first to fourth insulation layers 131a to 131d, the first to fourth conductive layers 132a to 132d, the second isolation and insulation layer 133, the fifth insulation layer 141, and the fifth conductive layer 142 are formed to expand in a two-dimensional manner in the horizontal direction parallel to a semiconductor substrate 101. Further, all of these layers are formed separately from the other conductive layers and insulation layers. Accordingly, the first isolation and insulation layer 123, the isolation layer 127, the first to fourth insulation layers 131a to 131d, the first to fourth conductive layers 132a to 132d, the second isolation and insulation layer 133, the fifth insulation layer 141, and the fifth conductive layer 142 that are formed in the peripheral circuit area 70 and laminated on the vertical top surface with respect to the planar-type transistors are referred to as a "dummy wiring layer 100", since they are formed in electrical isolation from each other and hence does not function on the circuits.

Note that the first isolation and insulation layer 123, the isolation layer 127, the first to fourth insulation layers 131a to 131d, the first to fourth conductive layers 132a to 132d, the second isolation and insulation layer 133, the fifth insulation layer 141, and the fifth conductive layer 142 are preferably formed with the same material and the same thickness as those of the conductive layers and the insulation layers that are formed in the memory cell area 50. In addition, they are preferably formed in such a way that the respective top surfaces of the drain-side conductive layer 42 and the fifth conductive layer 142 that are formed on the top level are on the same plane.

However, in this embodiment, there may be a certain difference in height between the top surface of the drain-side conductive layer 42 formed in the memory cell area 50 and the top surface of the fifth conductive layer 142 formed in the peripheral circuit area 70. In short, it is only necessary to form the dummy wiring layer 100 on the top surface of the planar-type transistors that form the peripheral circuit area 70, and to provide such a small difference in height between the top surface of the drain-side conductive layer 42 formed in the memory cell area 50 and the top surface of the fifth conductive layer 142 formed in the peripheral circuit area 70 that would not cause adverse effects to the performance.

In addition, holes 150A to 150C (second holes) are formed to penetrate the fifth conductive layer 142, the fifth insulation layer 141, the second isolation and insulation layer 133, the first to fourth conductive layers 132a to 132d, the first to fourth insulation layers 131a to 131d, the isolation layer 127, and the first isolation and insulation layer 123. The holes 150A and 150C reach the $n^+$ areas 101B, while the hole 150B reaches the conductive layer 122. In addition, the respective side surfaces of the holes 150A to 150C are silicided in the dummy wiring layer 100.

Columnar conductive contacts 151A to 151C are formed in the vertical direction on the $n^+$ areas 101B and the transistor conductive layer 122 so that they pass through the holes 150A to 150C.

As illustrated in FIG. 4B, the contacts 151A and 151C (second contacts) connect the $n^+$ areas 101B that function as the drain/source of the planar-type transistor to a bit line BL/a source line SL. In addition, the contact 151B (first contact) connect the transistor conductive layer 122 that functions as a gate electrode to a gate line GL.

Note that the holes 150A to 150C are each preferably formed to have a cross-sectional area five to fifteen times larger than that of the contacts 151A to 151C. In addition, an insulation layer 160a (second insulation layer) is formed between the hole 150A and the contact 151A. Likewise, insulation layers 160b and 160c (second insulation layers) are formed between the hole 150B and the contact 151B as well as between the hole 150C and the contact 151C.

As illustrated in FIG. 4, in the lamination-type NAND flash memory 10 according to this embodiment, no height difference is generated between the memory cell area 50 and the peripheral circuit area 70 due to the dummy wiring layer 100 formed in the peripheral circuit area 70.

However, such lamination-type NAND flash memory with no dummy wiring layer formed in the peripheral circuit area, as illustrated in FIG. 5A, provides a large difference in height between the memory cell area 50 and the peripheral circuit area 70. This causes a difference in depth of focus in exposure, which may result in the upper portion of the memory cell part being cut off in Chemical Mechanical Polishing (hereinafter, referred to as "CMP"), or residual films being left on the top surface of the peripheral circuit part, as illustrated in FIG. 5B.

In contrast, the lamination-type NAND flash memory 10 according to this embodiment has the dummy wiring layer 100 formed on the peripheral circuit area 70, which results in flatness between the formed memory cell area 50 and peripheral circuit area 70. Therefore, this may avoid potential problems associated with the fact that the upper portion of the memory cell part can be polished in CMP, residual films can be left on the top surface of the peripheral circuit part, etc.

Manufacturing Method of this Embodiment

Referring now to FIGS. 6A to 6E, a method of manufacturing the lamination-type NAND flash memory 10 according to this embodiment as illustrated in FIG. 4A will be described below. Note that the conductive layers (such as the first to fourth word-line conductive layers 32a to 32d) are only illustrated in FIGS. 6A to 6E, while the other components, such as the columnar semiconductors CLmn, the source-side first insulation layer 21, the source-side isolation and insulation layer 23, or the first to fourth insulation layers between word lines 31a to 31d, are purposely omitted to simplify the drawings.

Photoresist patterns (not illustrated) are formed to open desired areas on the surface of the semiconductor substrate 11, into which areas ion is then injected to form $p^-$ type areas (P-well area) 11A and 101A (see FIG. 6A).

Then, photoresist patterns (not illustrated) are further formed to open desired areas on the surface of the semiconductor substrate 11, into which areas ion is injected to form $n^+$ areas 11B and 101B (see FIG. 6A). Note that the $n^+$ area 11B formed in the memory cell area 50 functions as a source line SL. Then, an insulation film (not illustrated) is formed on the semiconductor substrate 11, on which a polysilicon layer 200 doped with conductive impurities, such as phosphorus, and an insulation layer (not illustrated) are sequentially laminated (see FIG. 6A).

Then, the polysilicon layer 200 is segmented into the following layers by etching: one is a source-side conductive layer 22 that functions as a gate line SGS of the source-side selection transistor layer 20 in the memory cell area 50, and another is a transistor conductive layer 122 that functions as a gate electrode of a planar-type transistor in the peripheral circuit area 70 (see FIG. 6B). Likewise, the insulation layer (not illustrated) is separated into a source-side isolation and insulation layer 23 (not illustrated in FIG. 6B) and a first isolation and insulation layer 123 (not illustrated in FIG. 6B).

Then, an isolation layer 201, which is formed by aluminum oxide, is formed on the respective top surfaces of the source-side isolation and insulation layer 23 (not illustrated in FIG. 6B) and the first isolation and insulation layer 123 (not illustrated in FIG. 6B) (see FIG. 6B).

Then, insulation layers (not illustrated) and conductive layers 202a to 202d doped with conductive impurities, such as phosphorus, are alternately laminated on the top surface of the isolation layer 201. Further, two insulation layers (not illustrated) and a conductive layer 203 are sequentially laminated on the top surface of the conductive layer 202d in the top layer (see FIG. 6C).

Then, the isolation layer 201, the conductive layers 202a to 202d and 203, as well as a plurality of insulation layers (not illustrated) are separated into the following layers by etching: one is located on the memory cell area 50 (memory-cell conductive layer or memory-cell interlayer insulation layer), and another is located on the peripheral circuit area 70 (dummy wiring layer or dummy interlayer insulation layer).

As a result, the conductive layers 202a to 202d are separated into first to fourth word-line conductive layers 32a to 32d (memory cell conductive layers) that are formed in the memory cell area 50, and first to fourth conductive layers 132a to 132d (dummy wiring layer) that are formed in the peripheral circuit area 70. Likewise, the isolation layer 201 is separated into an isolation layer 27 that is formed in the memory cell area 50, and an isolation layer 127 that is formed in the peripheral circuit area 70. The conductive layer 203 is separated into a drain-side conductive layer 42 (memory cell conductive layer) that is formed in the memory cell area 50, and a fifth conductive layer 142 (dummy wiring layer) that is formed in the peripheral circuit area 70.

Figure 6C:
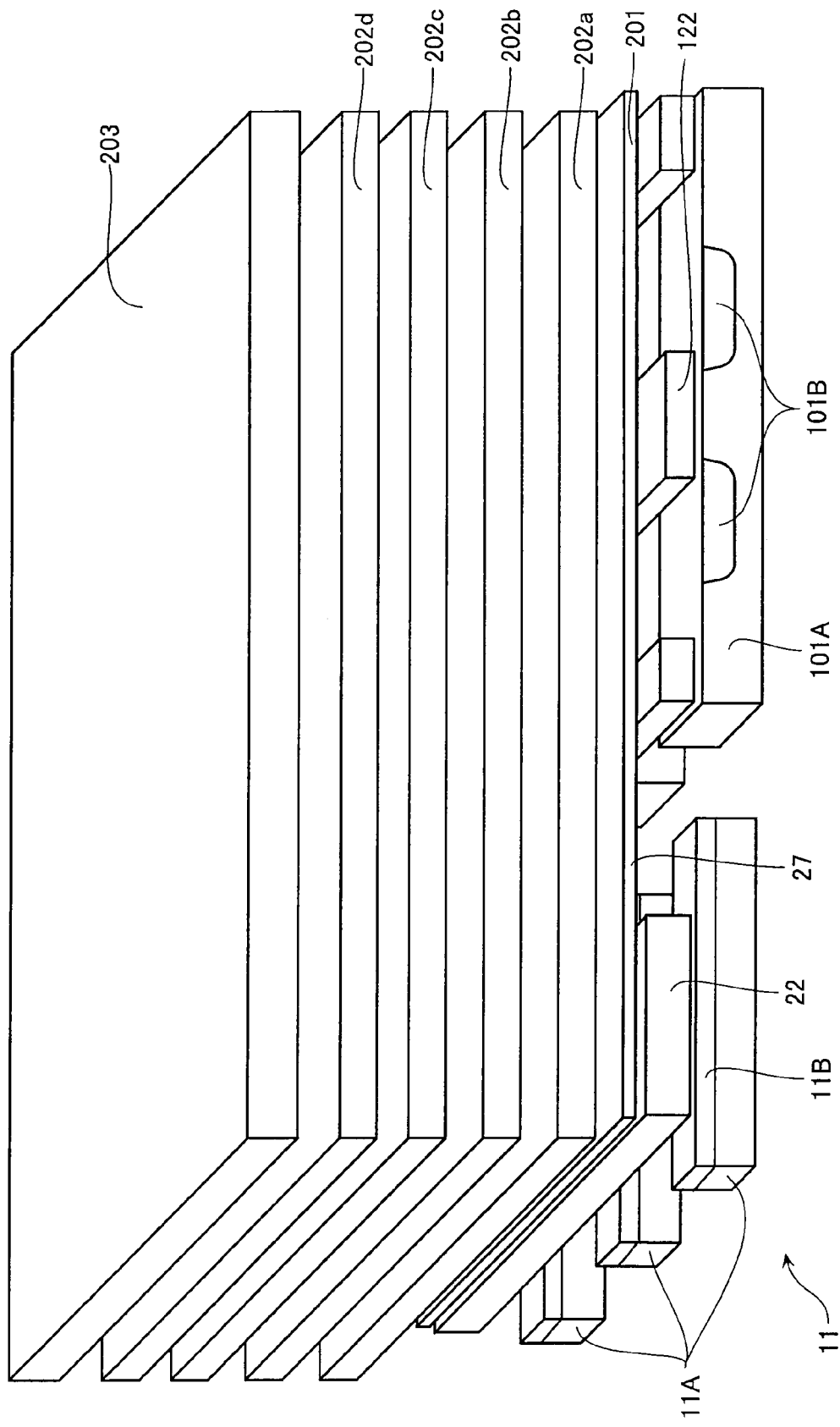
FIG. 6C is a diagram illustrating the method of manufacturing the lamination-type NAND flash memory.
Figure 6D:
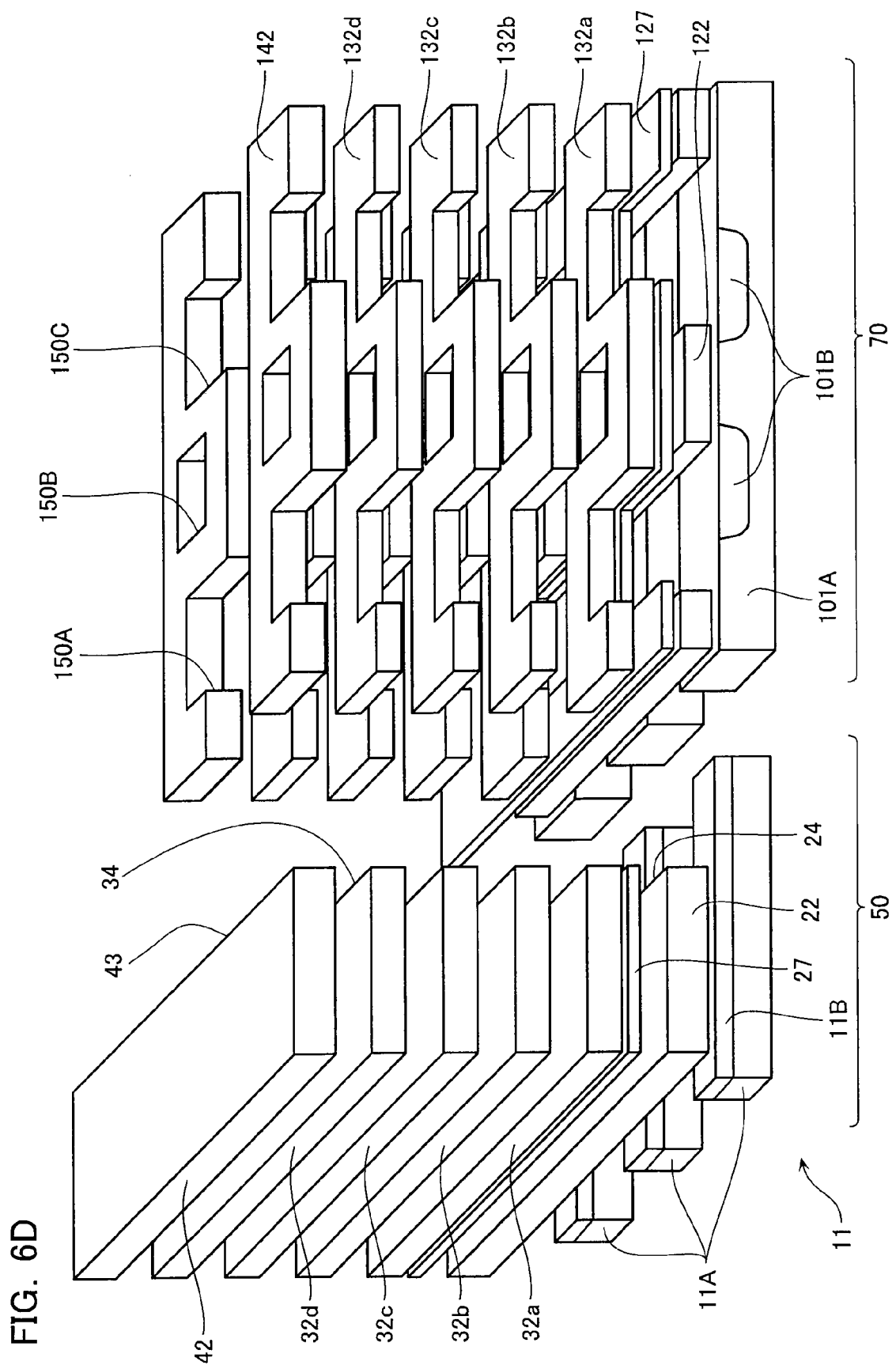
FIG. 6D is a diagram illustrating the method of manufacturing the lamination-type NAND flash memory.
Figure 6E:
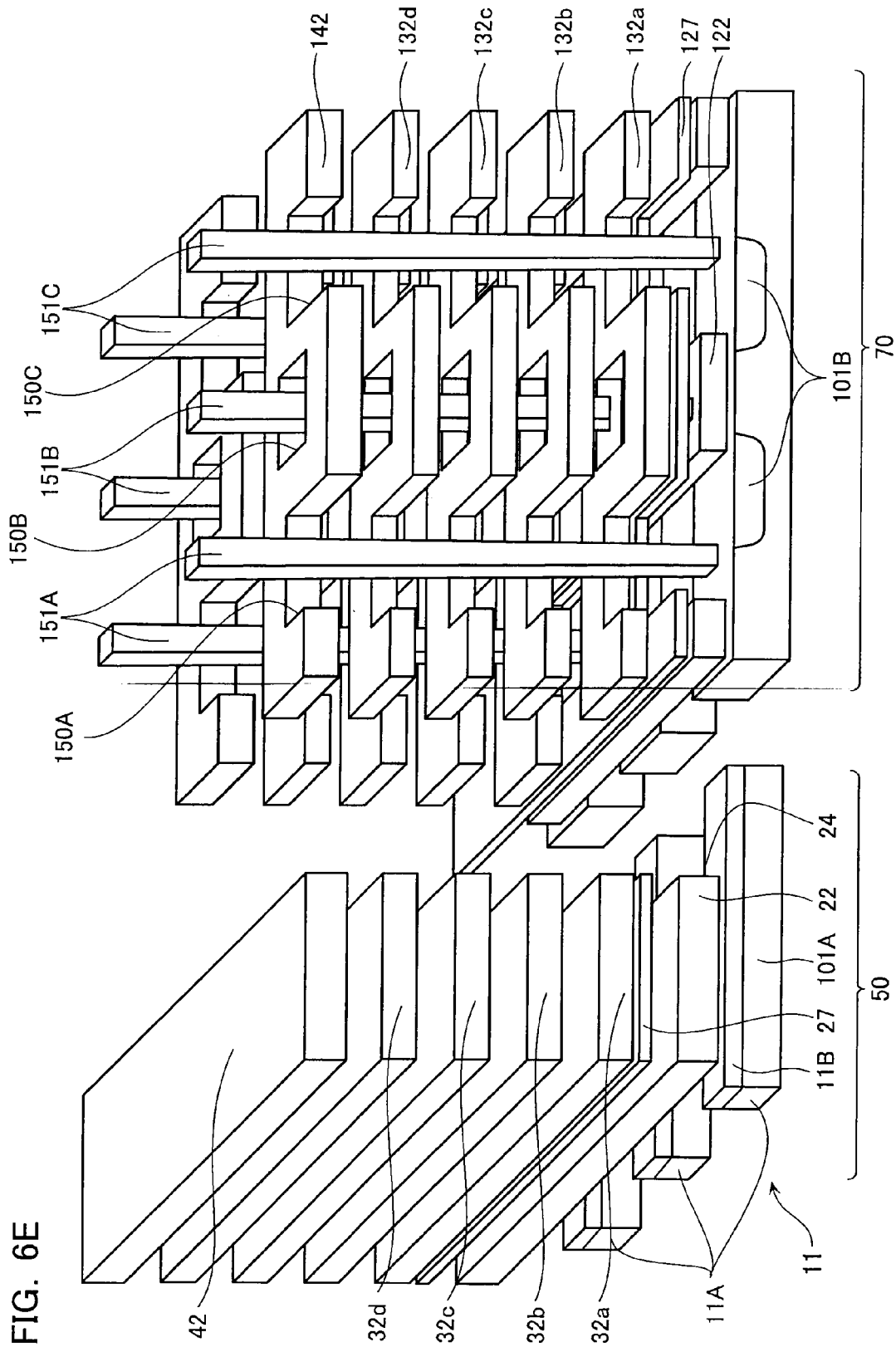
FIG. 6E is a diagram illustrating the method of manufacturing the lamination-type NAND flash memory.

The plurality of insulation layers (not illustrated) are separated into the following layers: first to fourth insulation layers between word lines 31a to 31d (memory-cell interlayer insulation layers; not illustrated), first to fourth insulation layers 131a to 131d (dummy interlayer insulation layers; not illustrated), a memory isolation and insulation layer 33 (memory-cell interlayer insulation layer; not illustrated), a second isolation and insulation layer 133 (dummy interlayer insulation layer; not illustrated), a drain-side insulation layer 41 (memory-cell interlayer insulation layer; not illustrated), and a fifth insulation layer 141 (dummy interlayer insulation layer; not illustrated) (see FIG. 6D).

In addition, holes 24 (first hole; not illustrated), 34 (first hole; not illustrated), 43 (first hole; not illustrated), 150A to 150C (second holes) are formed at the same time when etching is performed to form columnar semiconductors CLmn of memory strings MS in the memory cell area 50 and contacts 151 in the peripheral circuit area 70 (see FIG. 6D).

Then, silicon oxide layers 25, 35, and 44 (first insulation layers; not illustrated), a silicon nitride layer (not illustrated), and a silicon oxide layer 37 (not illustrated) are sequentially laminated in the holes 24, 34, and 43 (not illustrated) to form a so-called ONO film (not illustrated). In addition, metal, such as titanium, is formed on the respective surfaces of the holes 150A to 150C that are formed in polysilicon layers 132a to 132d and a silicon oxide layer (not illustrated) in the peripheral circuit area 70, and heat treatment is performed for silicidation of the surfaces. Then, insulation layers 160a to 160c (second insulation layers; not illustrated) are formed on the silicided surface. Note that the silicon nitride layer 36 formed in the memory cell area 50 becomes a charge accumulation layer of a memory transistor MT.

Then, amorphous silicon is deposited and CMP process is performed thereon, by which columnar semiconductors CLmn (not illustrated) are formed. Note that, instead of deposition of amorphous silicon, columnar semiconductors CLmn (not illustrated) of polysilicon may be formed by epitaxial growth of polysilicon films. Then, polysilicon doped with conductive impurities is further deposited to form contacts 151A to 151C (see FIG. 6E).

As can be seen from the above, according to this embodiment, the area of the NAND-type flash memory 10 may be reduced since the memory cells MC and the selection transistors ST are laminated in the vertical direction to the semiconductor substrate 11.

Further, the dummy wiring layer 100 is laminated in the peripheral circuit area 70 and the difference in height is reduced between the peripheral circuit area 70 and the memory cell area 50 in this embodiment, which may achieve improved operation of the lamination-type NAND flash memory 10.

It is intended that the memory cells that configure the lamination-type NAND flash memory 10 according to the present invention include any memory cells with a structure of memory strings MS (lamination structure), not limited to the structure as illustrated in FIG. 4A. By way of example, other structures are illustrated in FIGS. 7A and 7B.

The lamination-type NAND flash memory illustrated in FIG. 7A has a plurality of $n^+$ type diffusion areas 153 in a $p^-$ type area (P-well area) 152 on a semiconductor substrate 151. A columnar semiconductor CL is formed on each of the $n^+$ type diffusion areas 153. Note that FIG. 7A illustrates a portion where $n^+$ type diffusion areas 153A to 153C of the $n^+$ type diffusion areas 153 so formed.

As illustrated in FIG. 7A, columnar semiconductors CLA and CLB are formed on the $n^+$ type diffusion areas 153A and 153C. A conductive contact 154 is formed on the $n^+$ type diffusion area 153B and connected to a source line (not illustrated).

Insulation layers 155a to 155f and conductive layers 156a to 156f are formed in such a way that they are alternately laminated from those portions on the semiconductor substrate 151 between the $n^+$ type diffusion areas 153A and 153B. In addition, the insulation layers 155a to 155f and the conductive layers 156a to 156f are formed in contact with the columnar semiconductor CLA.

Likewise, insulation layers 157a to 157f and conductive layers 158a to 158f are formed in such a way that they are alternately laminated from those positions on the semiconductor substrate between the $n^+$ type diffusion areas 153B and 153C. In addition, the insulation layers 157a to 157f and the conductive layers 158a to 158f are formed in contact with the columnar semiconductor CLB.

Bit lines (not illustrated) are connected to the respective top surfaces of the columnar semiconductors CLA and CLB.

The conductive layers 156a and 158a function as the gates of the corresponding source-side selection transistors. That is, the gate of the source-side selection transistors is formed on the same plane as the lowermost conductive layer formed in the closest proximity to the semiconductor substrate 151 among the conductive layers. The conductive layers 156b to 156e and 158b to 158e function as the gates of the corresponding memory transistors. The conductive layers 156f and 158f function as the gates of the corresponding drain-side selection transistors. The conductive layers 156a and 158a control not only the columnar semiconductors CLA and CLB, but also those channels formed between the $n^+$ type diffusion areas 153A and 153B, and between the $n^+$ type diffusion areas 153B and 153C.

The current path of the memory cell illustrated in FIG. 7A is in the order of: the bit lines (not illustrated), the columnar semiconductor CL, the semiconductor substrate 151, the contact 154, and then the source line (not illustrated). The memory cell of this structure may also provide the advantages of this embodiment.

The structure of the memory cell illustrated in FIG. 7B will now be described below.

The memory cell of the lamination-type NAND flash memory illustrated in FIG. 7B has an $n^+$ type diffusion area 173 on a p⁻ type area (P-well area) 172 on a semiconductor substrate 171. A columnar semiconductor CL is formed in U-shape on the n⁺ type diffusion area 173. In other words, the columnar semiconductors CLA and CLB are formed on the semiconductor substrate 171 in such a way that they are connected to each other at the bottom surface.

Insulation layers 174a to 174e and conductive layers 175a to 175e as well as insulation layers 176a to 176e and conductive layers 177a to 177e are formed in such a way that they are alternated laminated on the n⁺ type diffusion area 173 and in contact with the outside of the columnar semiconductor CL formed in U-shape.

A bit line (not illustrated) is connected to the top surface of the columnar semiconductor CLA. A source line (not illustrated) is connected to the top surface of the columnar semiconductor CLB.

The conductive layers 175a to 175d as well as the conductive layers 177a and 177d function as the gates of the corresponding memory transistors. The conductive layer 175e functions as the gate of the corresponding drain-side selection transistor. The conductive layer 177e functions as the gate of the corresponding source-side selection transistor. That is, it is not necessary to form the source-side selection transistor layer 20 shown in FIG. 4A. As a result, it becomes easy to arrange the source-side selection gate lines.

Accordingly, the current path of the memory cell illustrated in FIG. 7B is in the order of: the bit lines (not illustrated), the columnar semiconductors CLA, CLB, then the source line (not illustrated), and it generally assumes a U-shape. The memory cell of this structure may also provide the advantages of this embodiment.

While embodiments of the lamination-type NAND flash memory have been described in the context of a non-volatile semiconductor memory, the present invention is not intended to be limited to the disclosed embodiments and various other changes, additions, replacements may be made thereto without departing from the spirit of the invention. For example, the contacts 151A to 151C are not limited to the staggered arrangement as illustrated in FIG. 4B, but may be positioned in line with each other unless short-circuited.

What is claimed is:

1. A non-volatile semiconductor storage device comprising:
  a memory cell area in which a plurality of electrically rewritable memory cells are formed; and
  a peripheral circuit area in which transistors are formed, the transistors configuring peripheral circuits to control the memory cells,
  the memory cell area comprising:
    a semiconductor layer formed to extend in a vertical direction to a semiconductor substrate;
    a plurality of conductive layers extending in a parallel direction to the semiconductor substrate, and laminated in a vertical direction to the semiconductor substrate; and
    a property-varying layer formed between the semiconductor layer and the conductive layers, the property-varying layer further including a first insulation layer, a second insulation layer, and a third insulation layer sandwiched between the first and second insulation layers, the third insulation layer being formed of a material different from those of the first and second insulation layers,
  the peripheral circuit area comprising:
    a plurality of dummy wiring layers each formed on a same plane as each of the plurality of conductive layers and electrically separated from the conductive layers,
    wherein
    the plurality of dummy wiring layers have an opening, planar-type transistors are formed on the semiconductor substrate in the peripheral circuit area, and
    a contact is formed to penetrate the opening of the plurality of dummy wiring layers to be connected to the planar-type transistors.

2. The non-volatile semiconductor storage device according to claim 1, wherein
  the plurality of dummy wiring layers are formed over the semiconductor substrate so as to sandwich interlayer insulation layers therebetween.

3. The non-volatile semiconductor storage device according to claim 1, wherein
  the side surface of the contact is silicided.

4. The non-volatile semiconductor storage device according to claim 1, wherein
  a memory string is formed with the plurality of memory cells connected in series along the semiconductor layer, and selection transistors are formed on both ends of the memory string to select the memory cells.

5. The non-volatile semiconductor storage device according to claim 1, wherein
  said contact comprises first and second contacts,
  a transistor conductive layer is formed between a lowermost layer of the plurality of dummy wiring layers and the semiconductor substrate, so as to be sandwiched between the impurity diffusion areas, wherein the transistor conductive layer functions as gate electrodes of the planar-type transistors,
  the transistor conductive layer is connected to said first contact, and
  each of the impurity diffusion areas is connected to said second contact.

6. The non-volatile semiconductor storage device according to claim 5, wherein
  a memory string is formed with the plurality of memory cells connected in series along the semiconductor layer, and selection transistors are formed on both ends of the memory string to select the memory cells.

7. The non-volatile semiconductor storage device according to claim 5, wherein
  the side surfaces of the first and second contacts are silicided.

8. The non-volatile semiconductor storage device according to claim 5, wherein
  one of the first and second contacts is formed in holes via insulation layers, the holes being formed to penetrate the dummy wiring layers.

9. The non-volatile semiconductor storage device according to claim 1, wherein
  the transistor conductive layer is formed on the same plane as a lowermost dummy conductive layer formed in the closest proximity to the semiconductor substrate among the conductive layers.

10. The non-volatile semiconductor storage device according to claim 1, wherein
  an aluminum oxide layer is formed on a top surface of a lowermost conductive layer formed in closest proximity to the semiconductor substrate among the plurality of conductive layers, and on a top surface of a transistor conductive layer formed between a lowermost dummy conductive layer formed in closest proximity to the semiconductor substrate among the plurality of dummy wiring layers and the semiconductor substrate.

11. The non-volatile semiconductor storage device according to claim 1, wherein
said contact comprises first and second contacts and one of the first and second contacts is formed to penetrate the opening of the plurality of dummy wiring layers to be connected to the planar-type transistors.

* * * * *